United States Patent
Sekikawa et al.

(10) Patent No.: US 6,858,489 B2
(45) Date of Patent: Feb. 22, 2005

(54) SEMICONDUCTOR DEVICE MANUFACTURING METHOD

(75) Inventors: Nobuyuki Sekikawa, Ashikaga (JP); Koichi Hirata, Sanjyo (JP); Masaaki Momen, Ojiya (JP); Shinya Enomoto, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/656,142

(22) Filed: Sep. 8, 2003

(65) Prior Publication Data

US 2004/0048434 A1 Mar. 11, 2004

Related U.S. Application Data

(62) Division of application No. 09/981,889, filed on Oct. 19, 2001.

(30) Foreign Application Priority Data

Oct. 20, 2000 (JP) .......................................... 2000-321250

(51) Int. Cl.[7] .............................................. H01L 21/00
(52) U.S. Cl. ...................... 438/238; 438/382; 438/385
(58) Field of Search ........................... 438/238, 381–385

(56) References Cited

U.S. PATENT DOCUMENTS

| | | | |
|---|---|---|---|
| 5,686,754 A | 11/1997 | Choi et al. | |
| 5,883,402 A | 3/1999 | Omura et al. | |
| 5,936,265 A | 8/1999 | Koga | |
| 6,069,036 A | * 5/2000 | Kim | ............................ 438/238 |
| 6,229,180 B1 | 5/2001 | Yoshida et al. | |
| 2002/0057187 A1 | 5/2002 | Sanfilipo et al. | |

FOREIGN PATENT DOCUMENTS

JP    2000-183175    12/1998

* cited by examiner

*Primary Examiner*—H. Jey Tsai
(74) *Attorney, Agent, or Firm*—Morrison & Foerster LLP

(57) ABSTRACT

This invention is directed to the reduction of voltage dependence and thus allows easy design of integrated semiconductor circuits. The device is equipped with a P− type resistance layer, in which a first voltage is applied to one end and a second voltage is applied to the other end and which is formed on the surface of an N-well region on the semiconductor substrate, a thin oxide film on the resistance layer, and a resistance bias electrode which includes the silicon layer formed on the thin oxide film. By adjusting the voltage applied to the resistance bias electrode, the voltage dependence of the resistance of the resistance layer is reduced.

8 Claims, 10 Drawing Sheets

R=0

R=0.2

R=0.4

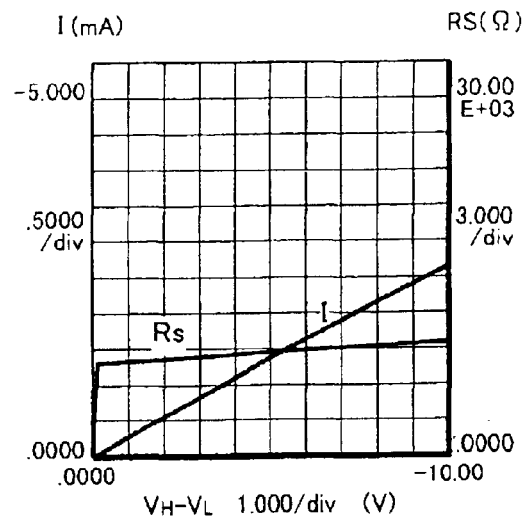
FIG.10(A) R=0.5
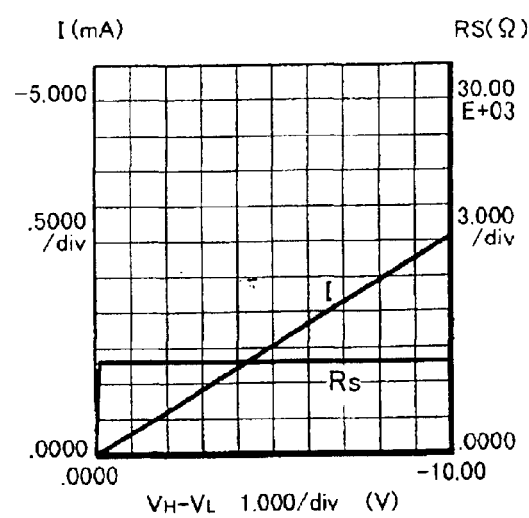
FIG.10(B) R=0.6
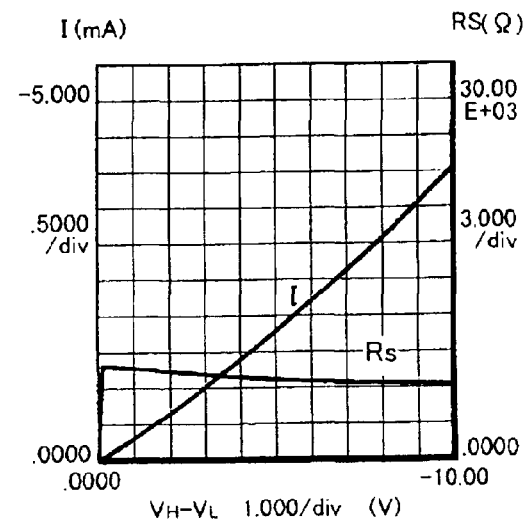
FIG.10(C) R=0.8

SEMICONDUCTOR DEVICE MANUFACTURING METHOD

REFERENCE TO RELATED APPLICATIONS

This application is a division of Ser. No. 09/981,889, filed Oct. 19, 2001, currently pending.

BACKGROUND OF THE INVENTION

1. Technical Field of the Invention

This invention relates to a semiconductor device and its manufacturing method, especially to a semiconductor device in which resistor elements are integrated on a semiconductor substrate.

2. Background of the Invention

Resistor elements have been used in a variety of semiconductor integrated circuits, including resistors for delay circuits, resistors for oscillator circuits, and ladder resistors for Analog-Digital converters. FIG. 11 is a cross-sectional view of the structure of a prior art semiconductor device. On N− type semiconductor substrate 50, field oxide films 51 are formed. P− type resistance layer 52 is formed on the surface of the N− type semiconductor substrate 50 between the field oxide films 51. Also, on both sides of the P− type resistance layer 52, P+ type electrode pad layers 53 and 54 are formed.

FIG. 12 is shows a cross section of the semiconductor device of FIG. 11 in use. The voltage VL is applied to the electrode pad layer 53, and the voltage VH is applied to the electrode pad layer 54 in the Figure. Hence, when the voltage of the N type semiconductor substrate 50 is 0V, it is supposed that VH<VL<0V. That is, forward bias of the P+ type electrode pad layers 53 and 54 and the N type semiconductor substrate 50 is prevented. Also, in terms of absolute value, voltage VH is greater than voltage VL. Therefore, electric current goes through the P− type resistance layer 52 according to the voltage difference (VH−VL).

When the resistance layer 52 is used as a resistor element in a semiconductor integrated circuit, it is desirable that there be no voltage dependence of the resistance value for the sake of circuit design. However, when voltage VH is applied to the P+ type electrode pad layer 54, the depletion layer 55 between the N type semiconductor substrate 50 and the resistance layer 52 is expanded. Therefore, the P− type resistance layer 52 is narrowed down, causing the change in a resistance value, which depends on the voltage VH applied to the P+ type electrode pad layer 54. Also, when the voltage VH rises further, a pinch-off state takes place near the P+ type electrode pad layer 54, leading to saturation of the electric current.

SUMMARY OF THE INVENTION

This invention is directed to reducing voltage dependence as much as possible, which can simplify the design of semiconductor integrated circuits.

The semiconductor device of this invention has a resistance layer of a second conductivity type formed on the surface of the semiconductor substrate of a first conductivity type, where a first voltage is applied to one end of the device and a second voltage is applied to the other end, an oxide film formed on the resistance layer of the second conductivity type, and a resistance bias electrode layer comprising silicon layer on the oxide film. By adjusting the voltage applied to the resistance bias electrode layer, the voltage dependence of the resistance of the resistance layer of the second conductivity type can be reduced.

The method of manufacturing the semiconductor device of this invention includes forming an oxide film and a first silicon layer on the semiconductor device of the first conductivity type, selectively forming a oxidation resistance film on the first silicon layer, forming a field oxide film by thermal oxidation, removing the oxidation resistance film, forming a resistance layer of the second conductivity type on the surface of the semiconductor substrate by ion implantation of the impurity of the second conductivity type piercing through the first silicon layer and the oxide film, forming a second silicon layer covering the whole area, forming a resistance bias electrode layer on the resistance layer through the patterning of the first and second silicon layers, and forming a wiring layer for providing the resistance bias electrode layer with the predetermined voltage.

The manufacturing method of this invention allows for the reduction of manufacturing process steps, because the first silicon layer remains intact when the field oxide film is formed and then is used as a part (that is, a lower part) of the resistance bias electrode layer.

Furthermore, the resistance layer of the second conductivity type is formed by the ion implantation of the impurity of the second conductivity type piercing through the first silicon layer and the oxide film. Then, the second silicon layer is deposited on the first silicon layer. Thus, the first silicon layer functions as a buffer film against the ion implantation, and the acceleration energy of the ion implantation can be reduced compared to the case in which the single silicon layer is used as the resistance bias electrode layer.

BRIEF DESCRIPTION OF THE DRAWINGS

FIGS. 10(A)–10(C) are graphs showing the voltage characteristics and the resistance characteristics of the diffusion resistance (the difference in the voltages between the both sides of resistance being shown on the X-axis, and the electric current I and the resistance Rs being shown on the Y-axes).

DETAILED DESCRIPTION OF THE INVENTION

Now, the semiconductor device and the manufacturing method to which this invention applies will be explained by referring to FIGS. 1–6. In FIGS. 1–6, the region where the diffusion resistance is to be formed is shown in the right sides of the figures, and the region where P-channel MOS transistor is to be formed is shown in the left sides of the figures, respectively.

Figure 1:
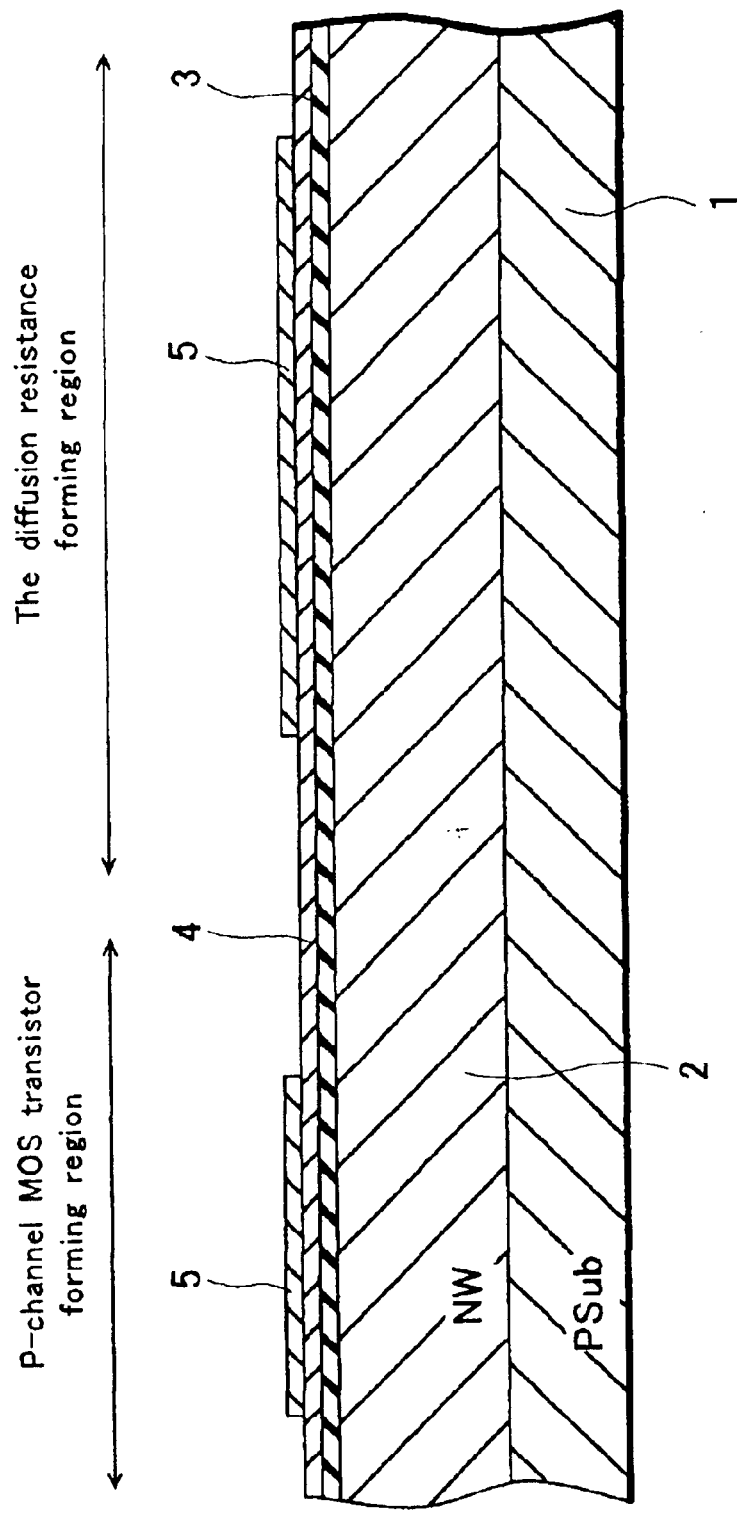
FIG. 1 is a cross-sectional view for explaining the manufacturing method of a semiconductor device of this invention.

As seen from FIG. 1, on the P− type silicon substrate 1, N− type well region 2 is formed. Also, on the P type silicon substrate 1, a thin oxide film 3 of a thickness of 10 nm–20 nm is formed by thermal oxidation. On this thin oxide film 3, the first polysilicon layer 4 of a thickness of 50 nm–100 nm and the silicon nitride film ($Si_3N_4$) 5 of 50 nm–100 nm are formed by an LPCVD method. Then, etching is performed selectively on the silicon nitride film 5. Here, instead of the first polysilicon layer 4, an amorphous silicon layer can be used.

By this, the double layer comprising the first polysilicon layer 4 and the silicon nitride film 5 remains in predetermined areas in both the P-channel MOS transistor forming region and the polysilicon resistance element forming region. Here, it is also possible to perform the etching selectively on the first polysilicon layer 4 and the silicon nitride film 5.

Figure 2:
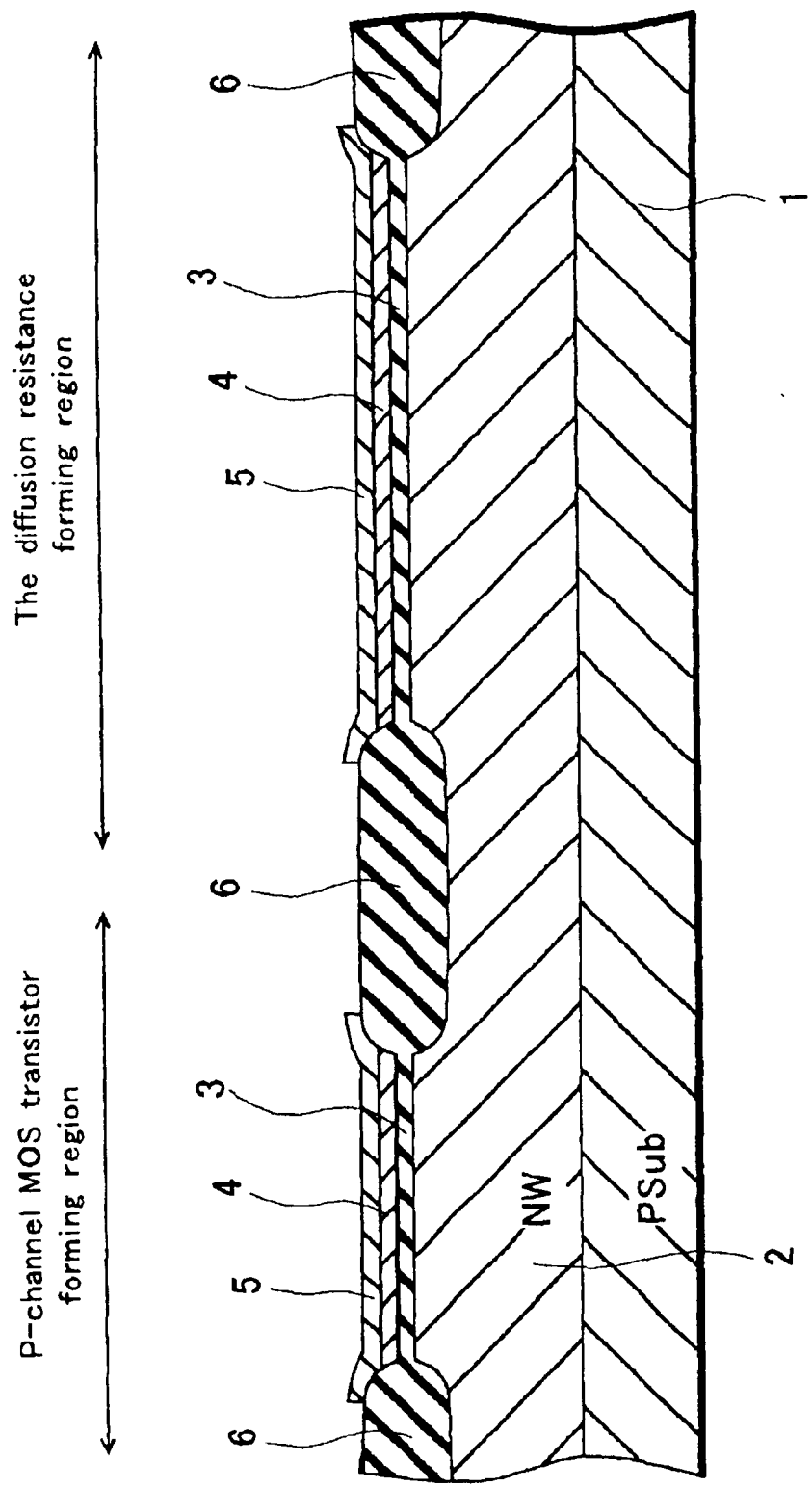
FIG. 2 is a cross-sectional view for explaining the manufacturing method of a semiconductor device of this invention.

Then, thermal oxidation at about 1000° C. is performed. As shown in FIG. 2, the field oxide film 6 is formed in the area where the silicon nitride film has been removed by etching. The thickness of the field oxide film 6 is about 500 nm.

Here, the silicon nitride film 5 functions as an oxidation resistance film. Also, the thin oxide film 3 is also called a pad oxide film, and it prevents crystal defects on the P type silicon substrate under the so-called bird's beak of the field oxide film 6.

Additionally, the first polysilicon layer 4 is called a pad polysilicon layer (pad silicon layer) and works to shorten the bird's beak. Usually, the thin oxide film 3 and the first polysilicon layer 4 are removed after the field oxidation. However, this manufacturing process keeps them intact and utilizes them as structural components of the resistor element as described later.

Figure 3:
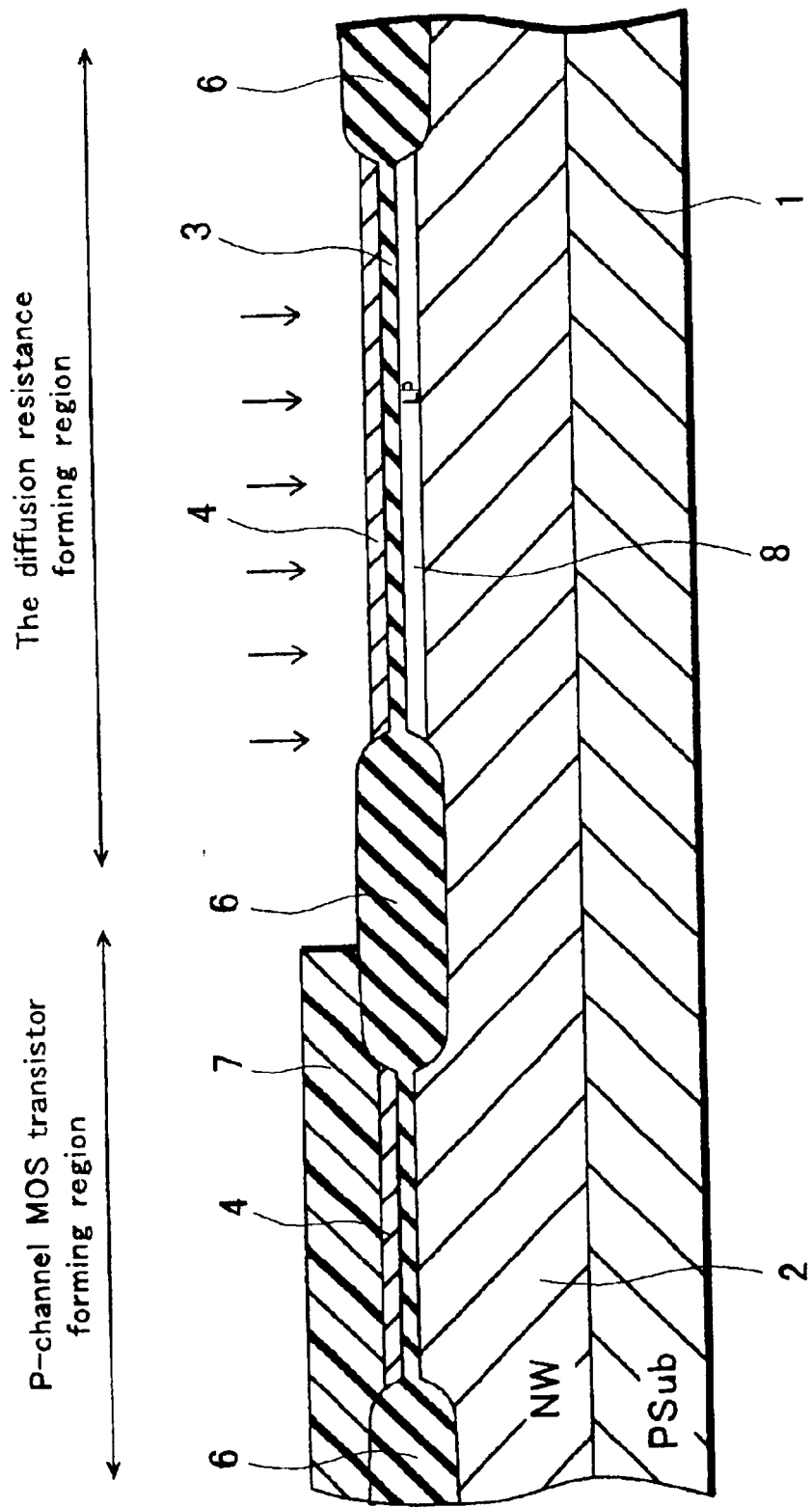
FIG. 3 is a cross-sectional view for explaining the manufacturing method of a semiconductor device of this invention.

Next, as shown in FIG. 3, a photoresist layer 7 is formed on the P-channel MOS transistor forming region after the silicon nitride film 5 is removed. Using this photoresist layer 7 as a mask, ion implantation of P− type impurity is performed piercing the first polysilicon layer 4 and the thin oxide film 3, and the P− type resistance layer 8 is formed on the surface of the N type well region 2. Here, the preferable condition of the ion implantation process is as follows: boron ion is used in the ion implantation, the acceleration energy is 60 KeV, and the dose is $5 \times 10^{12}/cm^2$.

During the ion implantation process described above, the first polysilicon layer 4 and the thin oxide film 3 function as a buffer film against the ion implantation and prevent crystal defects on the surface of the semiconductor substrate. Also, since the first polysilicon layer 4 is relatively thin, the acceleration energy of the ion implantation can be reduced.

Figure 4:
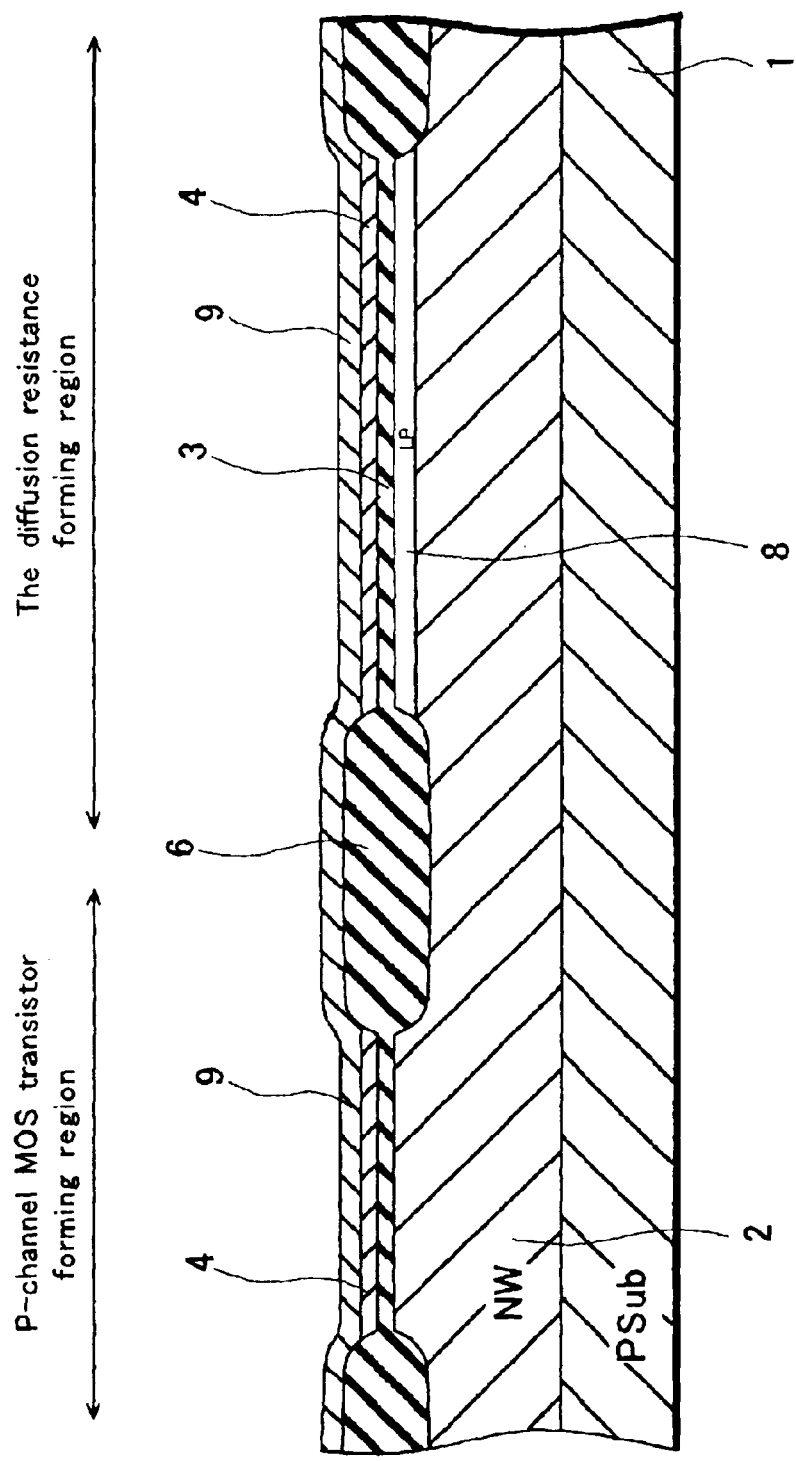
FIG. 4 is a cross-sectional view for explaining the manufacturing method of a semiconductor device of this invention.

Then, as shown in FIG. 4, the second polysilicon layer 9 of a thickness of 50 nm–100 nm is deposited to cover the whole surface by an LPCVD method after the removal of the photoresist layer 7 from the P-channel MOS transistor forming region. To the second polysilicon layer 9, the doping of an impurity such as phosphorus is performed by thermal diffusion, resulting in the reduction of the resistance of the second polysilicon layer 9. Here, by causing the impurity to diffuse reaching to the first polysilicon layer 4 beneath the second polysilicon layer 9, the resistance of the first polysilicon layer 4 is also reduced.

By this, the second polysilicon layer 9 is deposited on the first polysilicon layer 4 in the P-channel MOS transistor forming region as well as in the diffusion resistance forming region.

Figure 5:
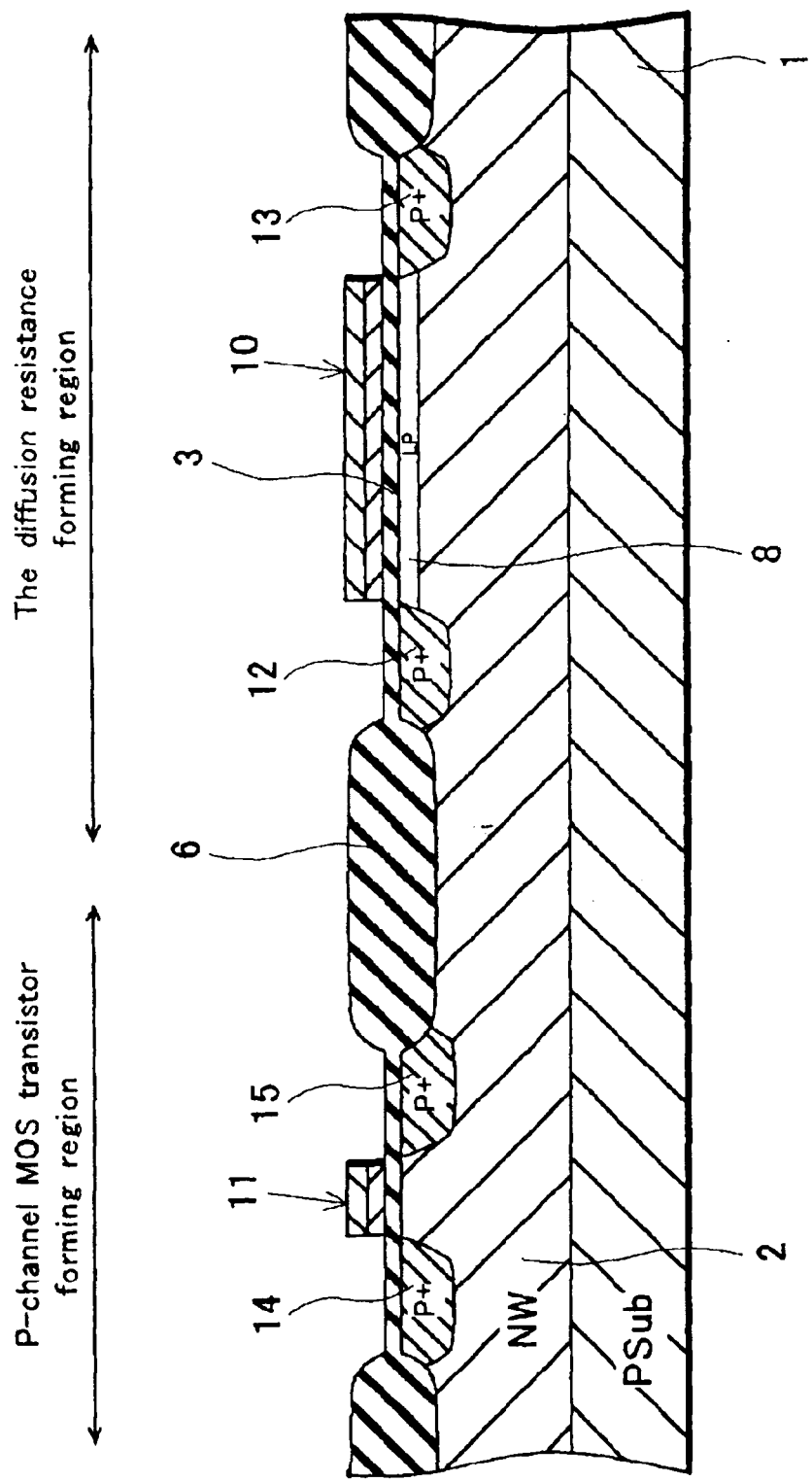
FIG. 5 is a cross-sectional view for explaining the manufacturing method of a semiconductor device of this invention.

Then, as shown in FIG. 5, in the predetermined area on the second polysilicon layer 9, the photoresist layer (not shown in the figure) is formed. Using this photoresist layer as a mask, the etching on the second polysilicon layer 9 and the first polysilicon layer 4 is sequentially and selectively performed.

By this, in the diffusion resistance forming region, a resistance bias electrode 10, on which the first polysilicon layer 4 and the second polysilicon layer 9 are deposited, is formed. On the other hand, in the P-channel MOS transistor forming region, a gate electrode 11, on which the first polysilicon layer 4 and the second polysilicon layer 8 are deposited, is formed. Also, on the field oxide film 6, a polysilicon wiring layer (not shown in the figure) comprising the second polysilicon layer 9 (single layer) is formed.

Furthermore, by implanting an ion such as boron, the P+ type electrode pad layers 12, 13, the P+ type source layer 14 and the P+ type drain layer 15 of the P-channel MOS transistor are formed.

Figure 6:
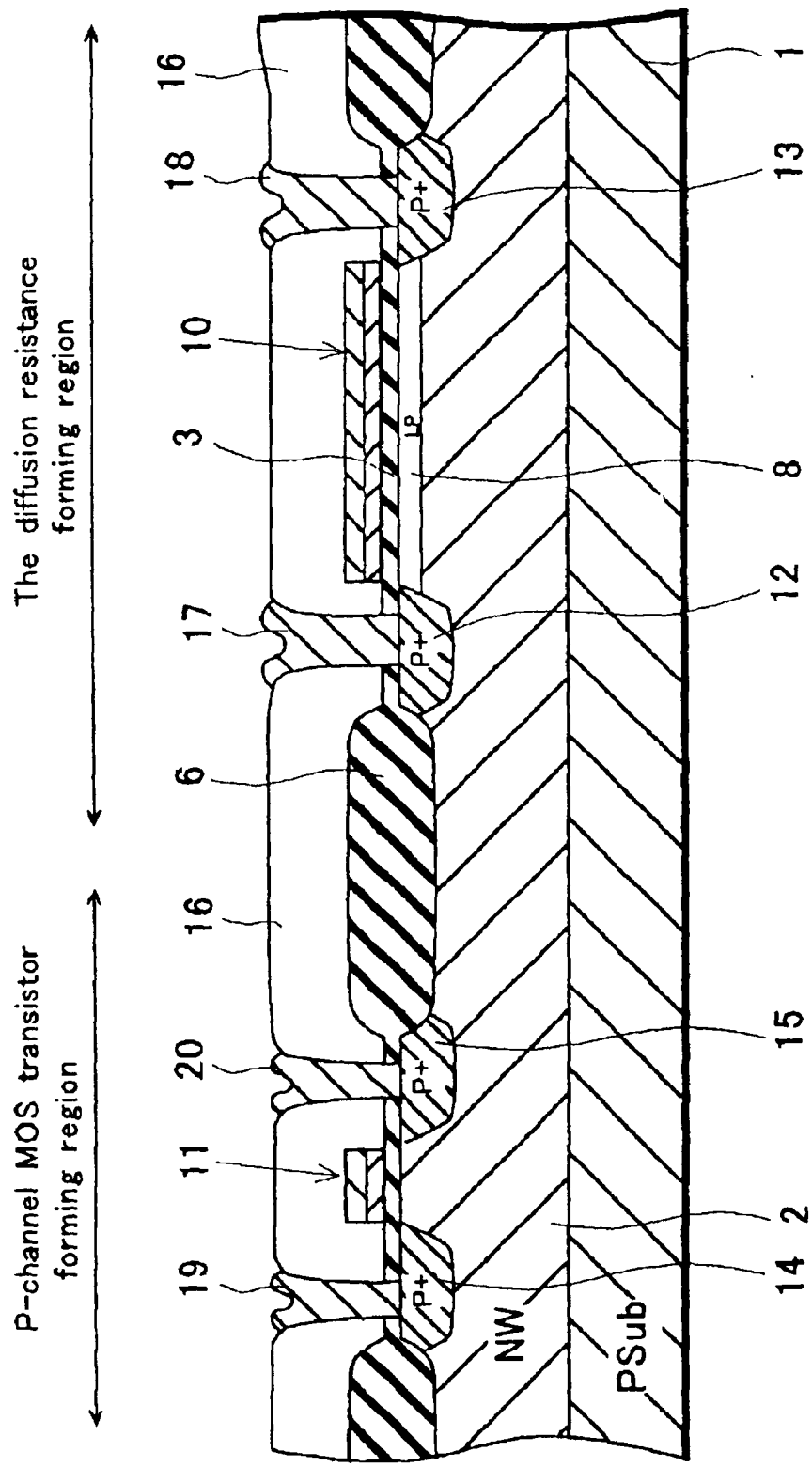
FIG. 6 is a cross-sectional view for explaining the semiconductor device and its manufacturing method of this invention.

Next, as shown in FIG. 6, an interlayer oxide film 16, such as a BPSG (boron-phosphorus silicon glass) film, is formed on the whole surface. On the P+ type electrode pad layers 12, 13, P+ type source layer 14 and the P+ type drain layer 15, contact holes are formed. Through those contact holes, resistance connection electrode 17, 18 comprising Al layer, a source electrode 19, and a drain electrode 20 are formed. This completes the semiconductor device with the diffusion resistance. Although the explanation about forming the MOS transistor is omitted here, it is formed on the same silicon substrate and is structured the same as the CMOS.

Figure 7:
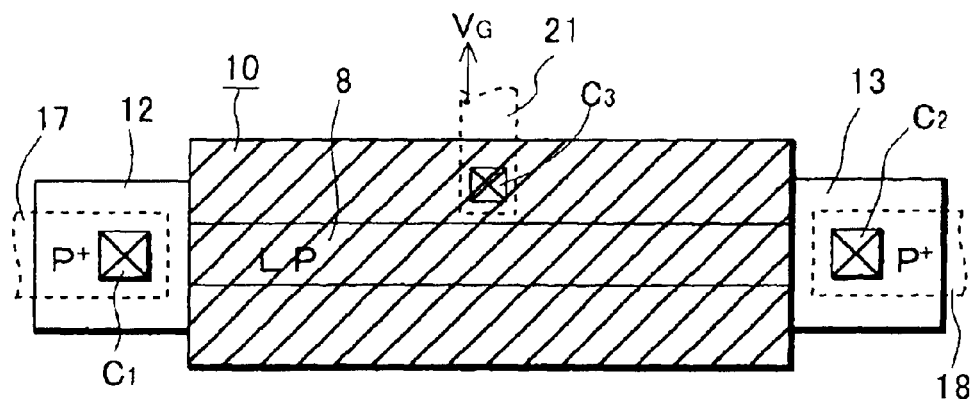
FIG. 7 is a plan view showing the diffusion resistance of the device of FIG. 6

FIG. 7 is a plan view of the diffusion resistance shown in FIG. 6. A strip of P− type resistance layer 8 extends between the P+ type electrode pad layers 12 and 13. Reference numerals C1 and C2 denote the contact holes formed on the P+ type electrode pad layers 12 and 13. The length of the P− type resistance layer 8 is determined according to the desired resistance value. Also, P− type resistance layer 8 is covered with the resistance bias electrode 10 with the thin oxide film 3 between them. This resistance bias electrode 10 is connected to the Al wiring layer 21 through the contact hole C3. A predetermined bias voltage VG is applied to the Al wiring layer 21 from a power source. By adjusting this bias voltage VG, the expansion of the depletion layer between the P− type resistance layer 8 and the N type well region 2 is suppressed.

Figure 8:
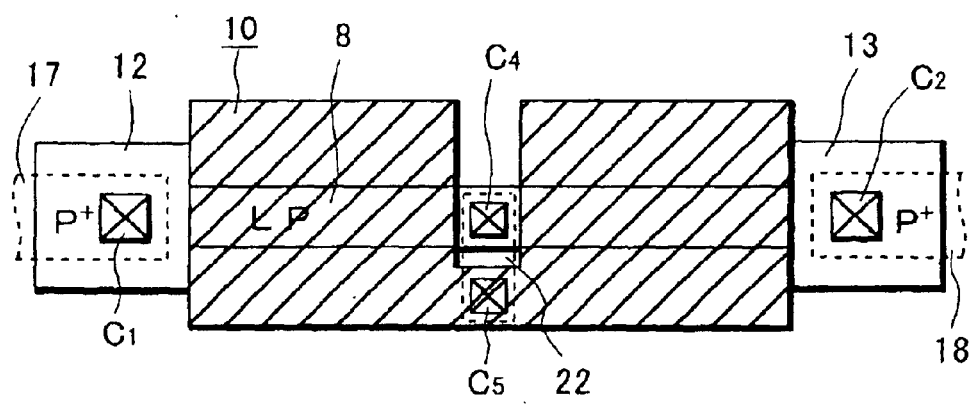
FIG. 8 is another plan view showing the diffusion resistance of the device of FIG. 6.

FIG. 8 is another plan view of the diffusion resistance. Here, contact hole C4 is formed in the middle of the P− type resistance layer 8 in lateral direction, and contact hole C5 is formed on the resistance bias electrode 10. Through these contact holes C4 and C5, the P− type resistance layer 8 and the resistance bias electrode 10 are connected by the Al wiring layer 22. In this case, the voltage taken out from the P− type resistance layer 8 is applied to the resistance bias electrode 10. Thus, use of an additional power voltage source is not required, which is one of the advantages of this embodiment.

Figure 9A:
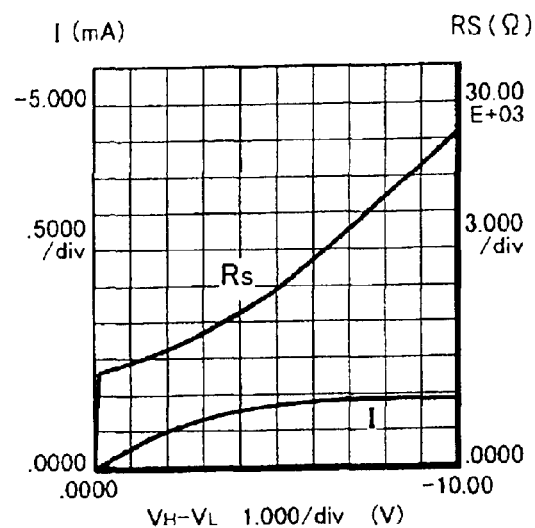
FIGS. 9(A)–9(C) are graphs showing the voltage characteristics and the resistance characteristics of the diffusion resistance (the difference in the voltages between the both sides of resistance being shown on the X-axis, and the electric current I and the resistance Rs being shown on the Y-axes).
Figure 9B:
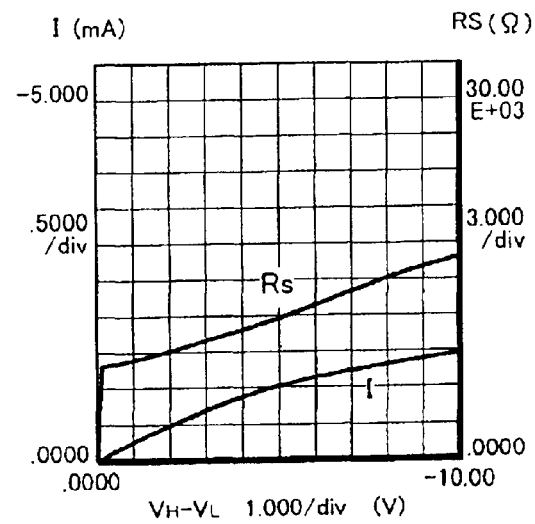
Figure 9C:
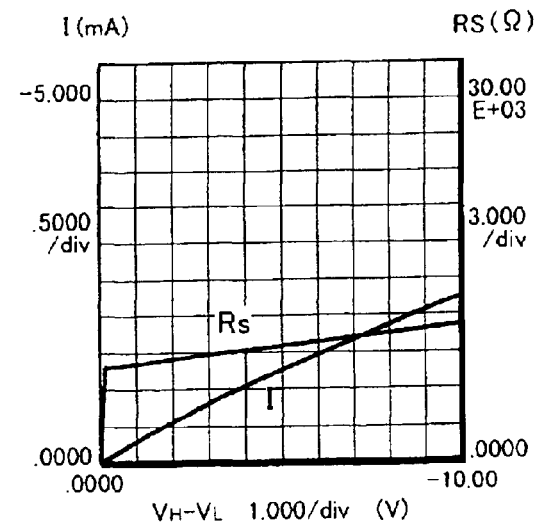
Figure 11:
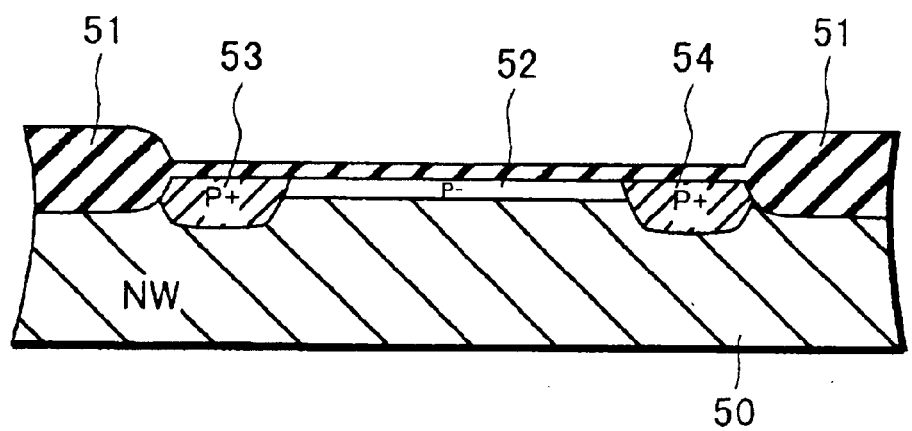
FIG. 11 is a cross-sectional view of a semiconductor device of the prior art.
Figure 12:
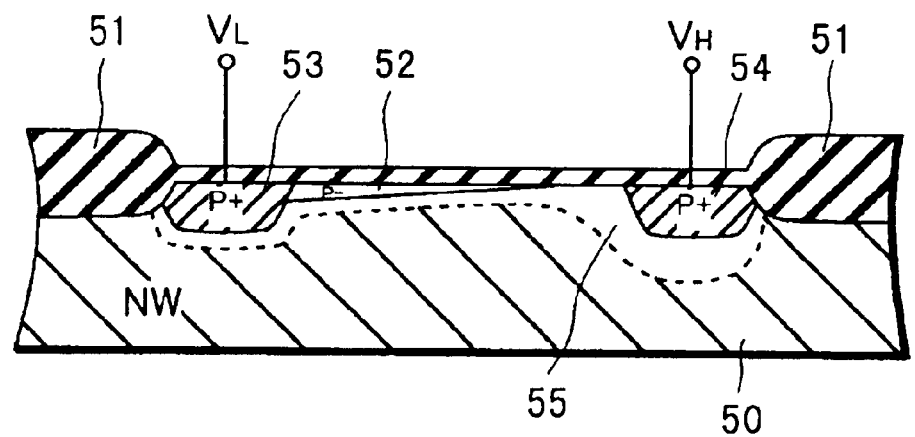
FIG. 12 is a cross-sectional view showing a semiconductor device of the prior art in use.

Next, experimental results of the semiconductor device will be explained by referring to FIGS. 9 and 10, which show the voltage characteristics and the resistance characteristics of the diffusion resistance (the difference in the voltages between both sides of resistance being shown on the X-axis, and the electric current I and the resistance Rs being shown on the Y-axes). Here, the voltage applied to the P+ type electrode pad layer 13 is VH, the voltage applied to the P+ type electrode pad layer 12 is VL, and the voltage applied to the resistance bias electrode 10 is VG.

It is defined that R=VG/(VH−VL), where R denotes the ratio of the voltages applied to the P+ type electrode pad layers 12, 13 (VH−VL) against the voltage VG applied to the resistance bias electrode 10. According to this definition, in FIG. 9(A), R=0, in FIG. 9 (B), R=0.2, and in FIG. 9(C), R=0.4. Also in FIG. 10(A), R=0.5, in FIG. 10(B), R=0.6, and in FIG. 10(C), R=0.8.

As shown by the above experimental results, the voltage dependence becomes smallest when R=0.6. When R=0.5, the voltage dependence is also small enough to be ignored. But when R=0.4 or less, the resistance value Rs rises as the voltage VH increases. It is believed that this is because the depletion layer has been expanded. On the other hand, when R=0.8, the resistance value Rs goes down as the voltage VH increases. It is believed that this is because an accumulation of carriers has taken place.

As explained above, since the semiconductor device of this invention is equipped with the oxide film as well as the resistance bias electrode on the resistance layer, the expansion of the depletion layer between the semiconductor substrate and the resistance layer is suppressed. Thus, the voltage dependence of the resistance of the resistance layer can be reduced.

The invention also has the advantage that an additional power source is not required, since the voltage applied to the resistance bias electrode layer is provided from the middle of the resistance layer in lateral direction.

Furthermore, the manufacturing method of this invention allows for the reduction of manufacturing process steps, because the first silicon layer remains intact when the field oxide film is formed and then is used as a part (lower part) of the resistance bias electrode layer.

Also, the resistance layer of the second conductivity type is formed by the ion implantation of the impurity of the second conductivity type piercing through the first silicon layer and the oxide film. Then, the second silicon layer is deposited on the first silicon layer. Thus, the first silicon layer functions as the buffer film against the ion implantation and the acceleration energy of the ion implantation can be reduced compared to the case in which the single silicon layer is used as the resistance bias electrode layer.

What is claimed is:

1. A method of manufacturing a semiconductor device, comprising:

forming an oxide film on a semiconductor substrate comprising a surface portion of a first conductivity type;

forming a first silicon layer on the oxide film;

selectively forming an oxidation resistance film on the first silicon layer;

forming a field oxide film by thermal oxidation in an area of the semiconductor substrate not covered by the oxidation resistance film;

removing the oxidation resistance film;

forming a resistance layer of a second conductivity type in the surface portion of the semiconductor substrate by ion implantation of an impurity of the second conductivity type piercing the first silicon layer and the oxide film;

forming a second silicon layer covering the the first silicon layer and the field oxide film;

forming a resistance bias electrode layer above the resistance layer by patterning the first and second silicon layers; and forming a wiring layer for providing the resistance bias electrode layer with a predetermined voltage.

2. The method of manufacturing the semiconductor device of claim 1, wherein the first and second silicon layers are made of polysilicon or amorphous silicon.

3. The method of manufacturing the semiconductor device of claim 1 or 2, wherein the oxidation resistance film is a silicon nitride film.

4. The method of manufacturing the semiconductor device of claim 1, therein the wiring layer contacts with the resistance layer at a middle portion of the resistance layer with respect to its lateral direction.

5. A method of manufacturing a semiconductor device having a MOS transistor and a resistor element on a semiconductor substrate, comprising:

forming an oxide film on a semiconductor substrate comprising a surface portion of a first conductivity type;

forming a first silicon layer on the oxide film;

selectively forming an oxidation resistance film on the first silicon layer over a MOS transistor forming region and a resistance forming region of the semiconductor substrate;

forming a field oxide film by thermal oxidation in an area of the semiconductor substrate not covered by the oxidation resistance film;

removing the oxidation resistance film;

forming a resistance layer of a second conductivity type in the surface portion of the semiconductor substrate by ion implantation of an impurity of the second conductivity type piercing the first silicon layer and the oxide film in the resistance forming region;

forming a second silicon layer covering the MOS transistor forming region and the resistance forming region;

forming simultaneously a resistance bias electrode layer above the resistance layer and a gate electrode of the MOS transistor in the MOS transistor forming region by patterning the first and second silicon layers;

forming simultaneously a source layer and a drain layer of the MOS transistor and a pair of electrode pad layers of the resistance layer; and forming a wiring layer for providing the resistance bias electrode layer with a predetermined voltage.

6. The method of manufacturing the semiconductor device of claim 5, wherein the first and second silicon layers are made of polysilicon or amorphous silicon.

7. The method of manufacturing the semiconductor device of claim 5 or 6, wherein the oxidation resistance film is a silicon nitride film.

8. The method of manufacturing the semiconductor device of claim 5, wherein the wiring layer contacts with the resistance layer at a middle portion of the resistance layer with respect to its lateral direction.

* * * * *